(12) United States Patent
Shibasaki et al.

(10) Patent No.: US 8,258,882 B2
(45) Date of Patent: Sep. 4, 2012

(54) CLOCK SIGNAL DISTRIBUTING DEVICE

(75) Inventors: Takayuki Shibasaki, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 66 days.

(21) Appl. No.: 12/821,610

(22) Filed: Jun. 23, 2010

(65) Prior Publication Data

US 2011/0006850 A1    Jan. 13, 2011

(30) Foreign Application Priority Data

Jul. 10, 2009 (JP) ................................. 2009-163989

(51) Int. Cl.
H03B 5/12 (2006.01)
(52) U.S. Cl. ..................... 331/55; 331/46; 331/117 FE
(58) Field of Classification Search ............. 331/55, 331/56, 51, 50, 48, 46, 172, 117 R, 117 FE, 331/167; 327/291, 293, 295
See application file for complete search history.

(56) References Cited

U.S. PATENT DOCUMENTS

| 5,751,665 A | 5/1998 | Tanoi | |
| 6,175,285 B1 * | 1/2001 | Gabara | 331/117 R |
| 2002/0003452 A1 | 1/2002 | Mizuno et al. | |
| 2004/0008092 A1 * | 1/2004 | Hajimiri et al. | 331/117 R |
| 2007/0063779 A1 | 3/2007 | Kanda et al. | |
| 2008/0122501 A1 | 5/2008 | Narusawa et al. | |

FOREIGN PATENT DOCUMENTS

| JP | 9-34584 A | 2/1997 |
| JP | 11-74762 A | 3/1999 |
| JP | 2007-82158 A | 3/2007 |
| JP | 2008-136030 A | 6/2008 |
| WO | WO 2008144152 A1 * | 11/2008 |

OTHER PUBLICATIONS

Chang, et al., "A New 6 GHz fully integrated Low Power Low Phase Noise CMOS LC Quadrature VCO", Radio Frequency Integrated Circuits (RFIC) Symposium, 2003 IEEE, Jun. 2003, pp. 295-298.*

* cited by examiner

Primary Examiner — Ryan Johnson
(74) Attorney, Agent, or Firm — Arent Fox LLP

(57) ABSTRACT

A clock signal distributing device includes a plurality of LC resonant oscillators, each resonating at a frequency conforming to values of a first inductor and a first capacitor to oscillate a signal, an injection locked LC resonant oscillator that resonates at a frequency conforming to values of a second inductor and a second capacitor to oscillate a signal which is synchronous with an input clock signal, and transmission lines that connect oscillation nodes of the plurality of LC resonant oscillators and the injection locked LC resonant oscillator with one another.

8 Claims, 9 Drawing Sheets

Related Art

Related Art

US 8,258,882 B2

CLOCK SIGNAL DISTRIBUTING DEVICE

CROSS-REFERENCE TO RELATED APPLICATIONS

This application is based upon and claims the benefit of priority of the prior Japanese Patent Application No. 2009-163989, filed on Jul. 10, 2009, the entire contents of which are incorporated herein by reference.

FIELD

The present invention relates to a clock signal distributing device.

BACKGROUND

For example, Japanese Unexamined Patent Application Publication No. 2008-136030 discloses a clock signal distributing device of a tree structure configured to distribute clock signals in the same phase as illustrated in FIG. 1. In the drawing, a phase locked loop (PLL) circuit 101 includes a circuit block 102, a voltage control oscillator (VCO) 103 and a frequency divider (FDIV) 104 to input a reference clock signal RCK and output a desired clock signal. The circuit block 102 includes a phase frequency detector (PFD), a charge pump (CP) and a low pass filter (LP). The clock signal which is output from the PLL circuit 101 is distributed to a circuit 106 via a buffer 105 of a tree structure. However, in distribution of high frequency clock signals, such a problem may occur that limited driving capability of the buffer 105 causes a variation in phase among the clock signals and an increase in consumption power.

For example, Japanese Unexamined Patent Application Publication No. 2007-82158 discloses another clock signal distributing device using a distributed VCO as illustrated in FIG. 2. In the drawing, a circuit block 201 includes a phase frequency detector (PFD), a charge pump (CP) and a low pass filter (LP) to input an output signal from a frequency divider 202 and a reference clock signal RCK and to output bias signals to three LC resonant oscillators 203. The frequency divider 202 divides the frequency of an oscillation signal from one LC resonant oscillator 203 and outputs the signal so frequency-divided to the circuit block 201. A feedback circuit including the circuit block 201, the LC resonant oscillator 203 and the frequency divider 202 has a PLL circuit configuration. Resistive elements 204 are connected between oscillation nodes of the respective LC resonant oscillators 203. The oscillation signals from the respective LC resonant oscillators 203 are respectively supplied to circuits 206 via buffers 205.

In addition, for example, Japanese Unexamined Patent Application Publication No. 11-74762 discloses a semiconductor integrated circuit device which includes at least two ring oscillation circuits in each of which a plurality of inverters are connected with one another in a multi-stage ring form and conductive wiring.

Further, for example, Japanese Unexamined Patent Application Publication No. 9-34584 discloses a clock signal distribution circuit which includes a clock distribution output circuit configured to output and distributes a first clock signal which synchronizes with an external clock signal which is input thereinto to each load circuit.

In the clock signal distributing device illustrated in FIG. 2, the oscillation node of each LC resonant oscillator 203 is included in a loop of the PLL circuit. Therefore, kicking back of a signal from the circuit 206 to the LC resonant oscillator 201 may directly affect the characteristic of the PLL circuit. In addition, because of the necessity to distribute the bias signal from the circuit block 201 to each LC resonant oscillator 203, noise may be mixed into the signal and hence the clock signal characteristic may be deteriorated. In addition, because of the necessary to design the PLL circuit together with the distribution circuit of the LC resonant oscillator, the clock signal distributing device of the type illustrated in FIG. 2 has such problems that it is difficult to design the device and arrangement of circuits is greatly limited.

SUMMARY

According to an exemplary aspect of embodiments, a clock signal distributing device includes: a plurality of LC resonant oscillators, each resonating at a frequency conforming to values of a first inductor and a first capacitor to oscillate a signal; an injection locked LC resonant oscillator that resonates at a frequency conforming to values of a second inductor and a second capacitor to oscillate a signal which is synchronous with an input clock signal; and transmission lines that connect oscillation nodes of the plurality of LC resonant oscillators and the injection locked LC resonant oscillator with one another.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DETAILED DESCRIPTION

Figure 1:
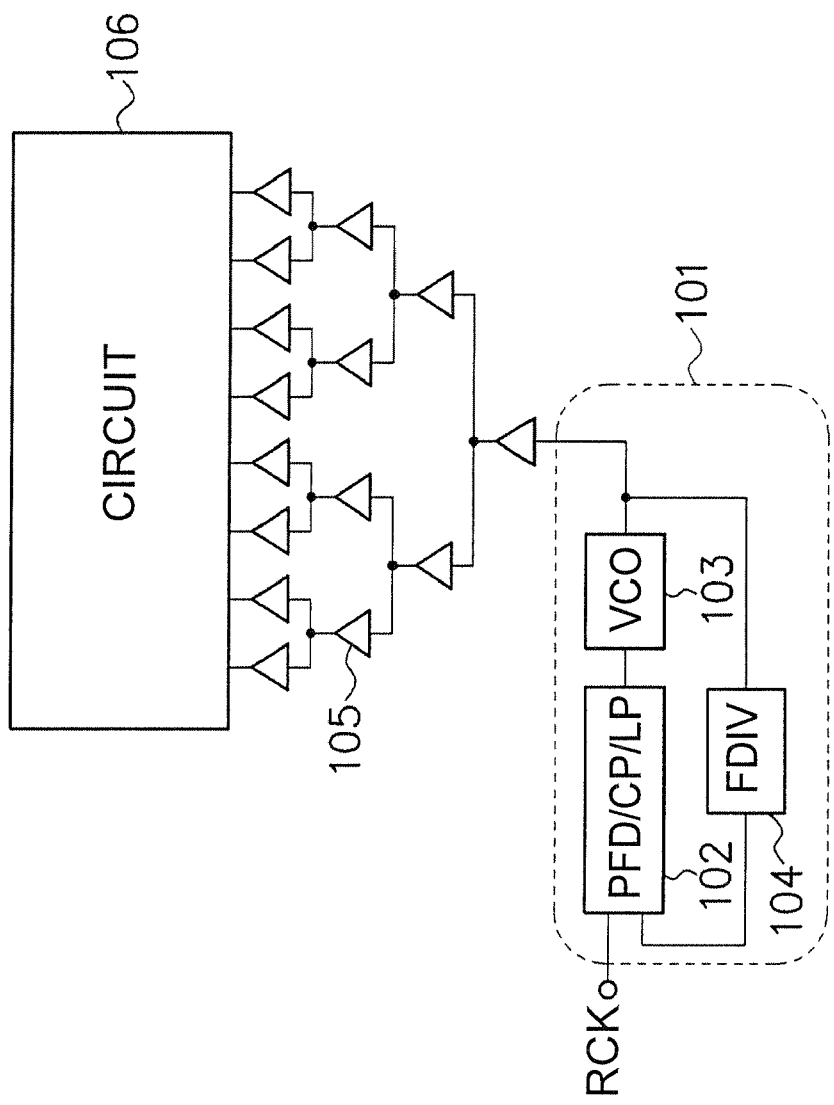
FIG. 1 is a diagram illustrating one clock signal distributing device, according to various aspects of the current invention.
Figure 2:
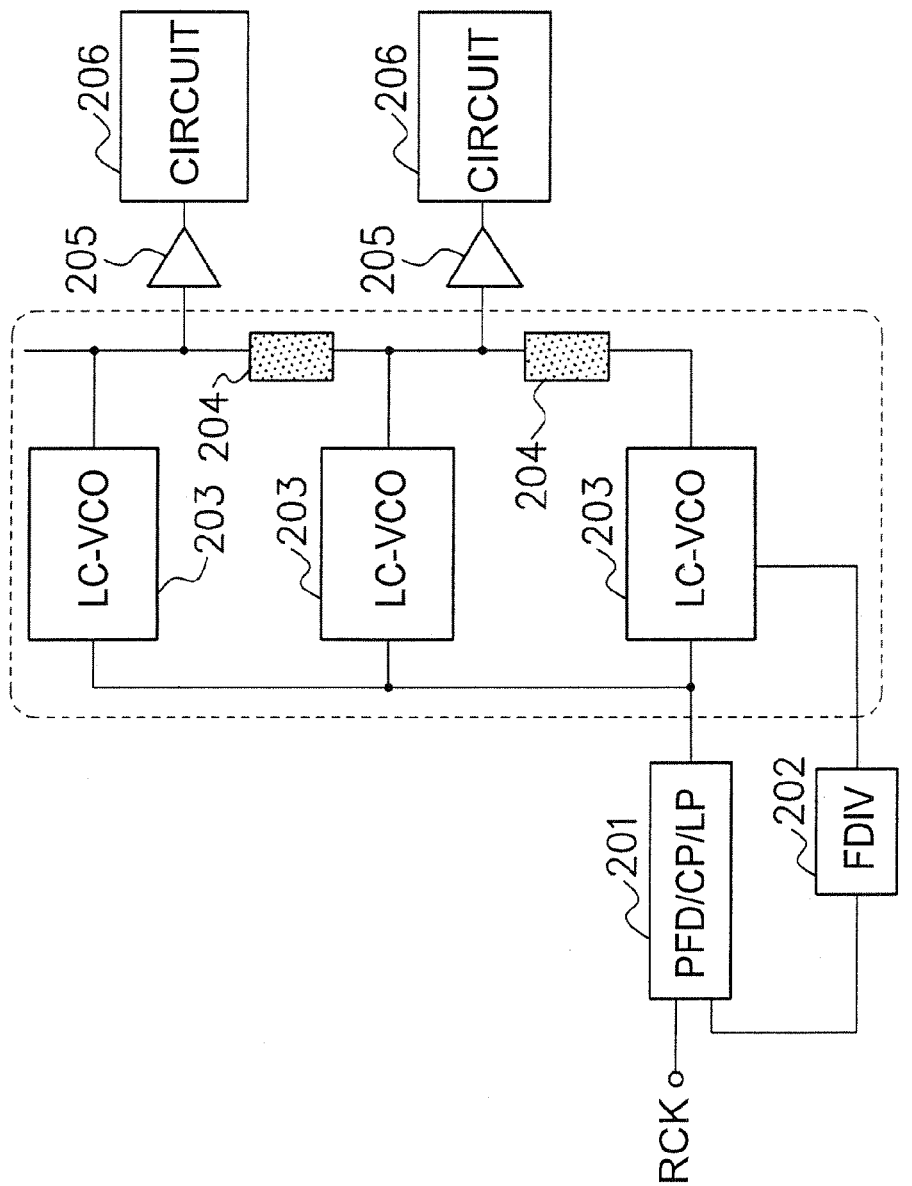
FIG. 2 is a diagram illustrating another clock signal distributing device, according to various aspects of the current invention.
Figure 3:
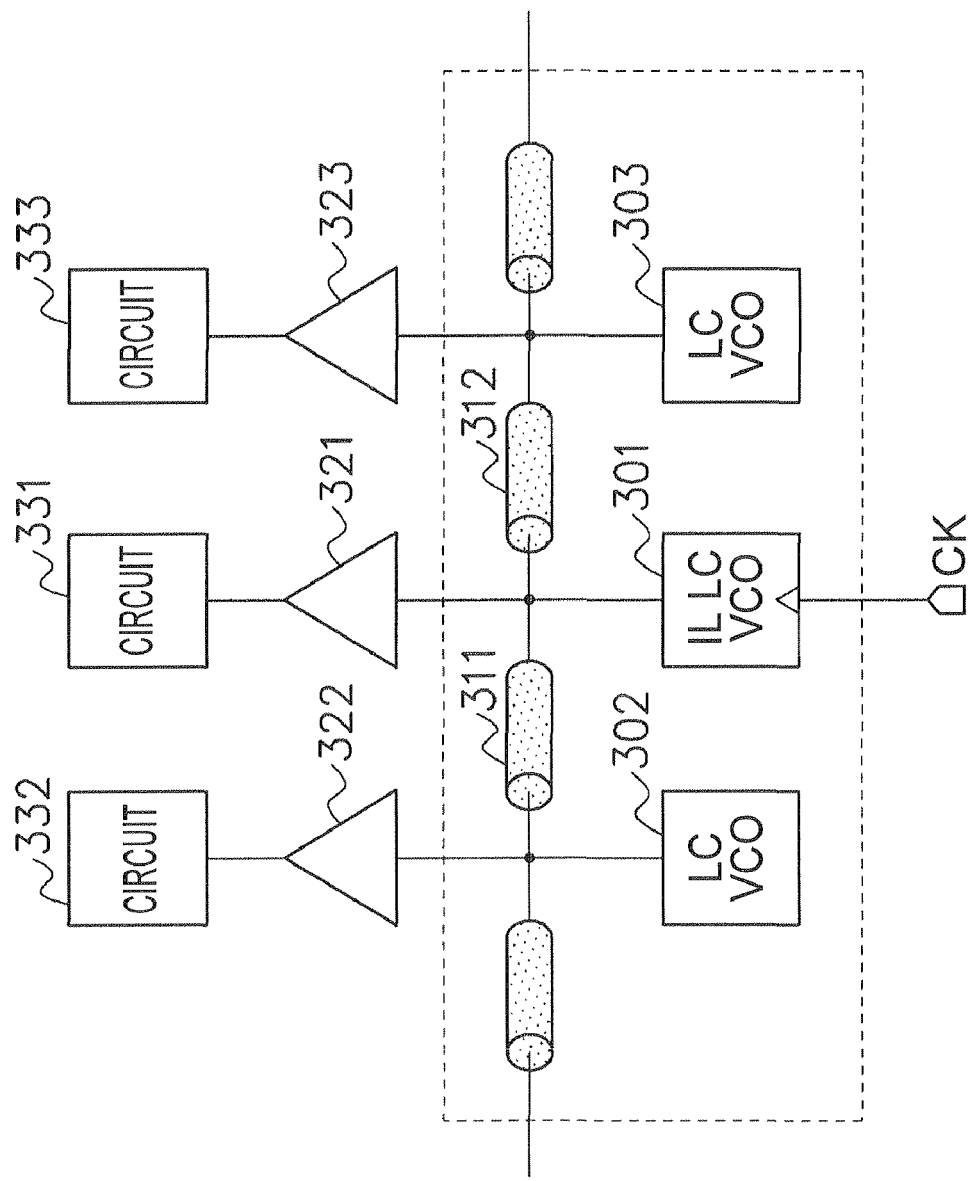
FIG. 3 is a block diagram illustrating an example of a clock signal distributing device according to various aspects of the current invention.

FIG. 3 is a block diagram illustrating an example of a clock signal distributing device according to various aspects of the current invention. As illustrated in FIG. 3, a plurality of LC resonant oscillators 302 and 303 are, for example, LC resonant voltage control oscillators, each resonating at a frequency conforming to values of a first inductor and a first capacitor to oscillate a signal. An injection locked LC resonant oscillator 301 is, for example, an injection locked LC resonant voltage control oscillator and resonates at a frequency conforming to values of a second inductor and a second capacitor to oscillate a signal which is synchronous with an input clock signal CK. Transmission lines 311 and 312 connect oscillation nodes of the plurality of LC resonant oscillators 302 and 303 and the injection locked LC resonant oscillator 301 with one another substantially at the same intervals. The transmission line 311 connects the oscillation node of the injection locked LC resonant oscillator 301 with the oscillation node of the LC resonant oscillator 302. The transmission line 312 connects the oscillation node of the injection locked LC resonant oscillator 301 with the oscillation node of the LC resonant oscillator 303. The transmission lines 311 and 312 have substantially the same line length. A buffer 321 amplifies a signal from the oscillation node of the injection locked LC resonant oscillator 301 and outputs the amplified signal to a circuit 331. A buffer 322 amplifies a signal from the oscillation node of the LC resonant oscillator 302 and outputs the amplified signal to a circuit 332. A buffer 323 amplifies a signal from the oscillation node of the LC resonant oscillator 303 and outputs the amplified signal to a circuit 333. The clock signal distributing device may be capable of distributing the input clock signal CK to, for example, the above mentioned three circuits 331 to 333. The detailed operation of the clock signal distributing device will be described in the following explanation of other aspects of the current invention.

Figure 4:
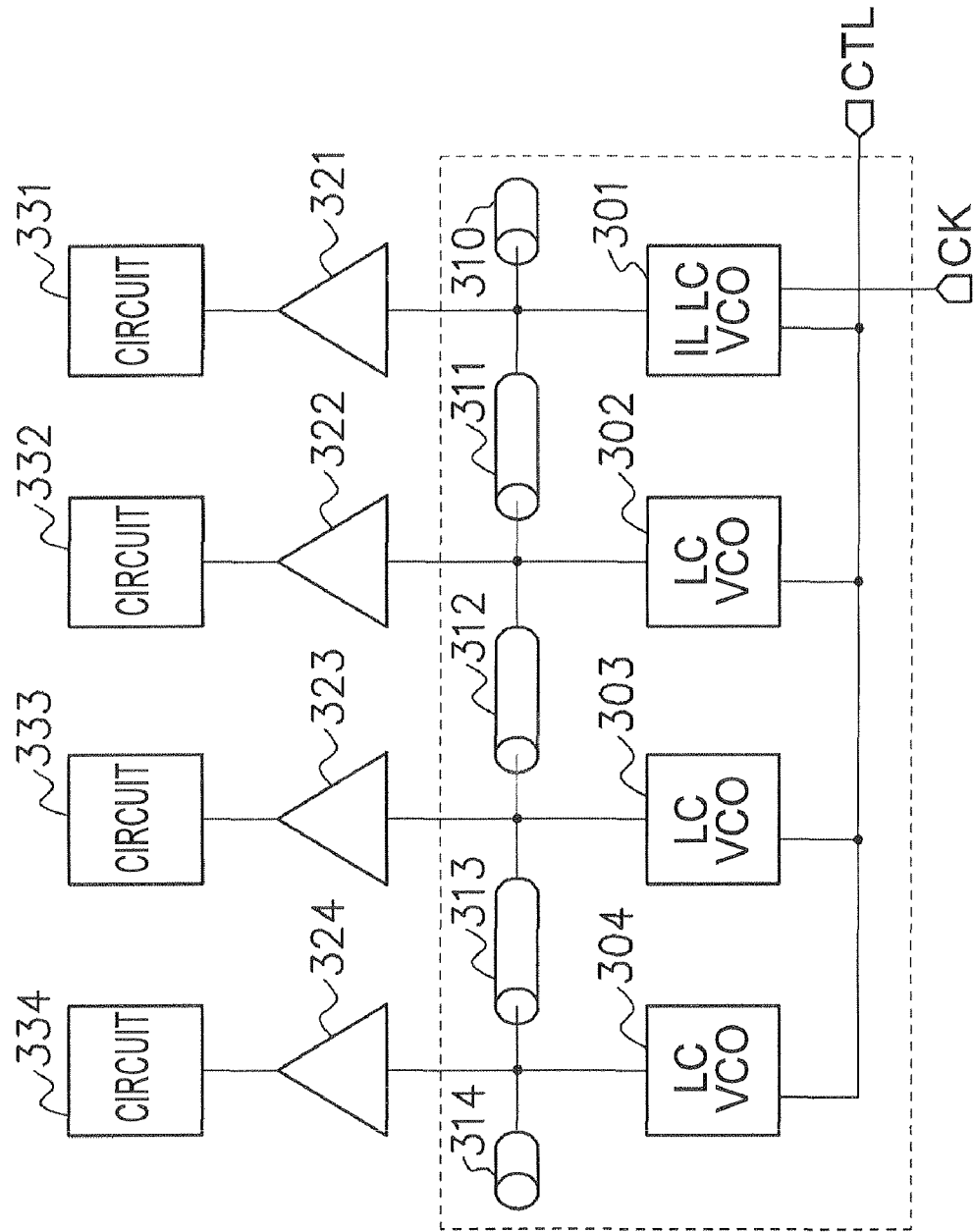
FIG. 4 is a block diagram illustrating an example of a clock signal distributing device according to various aspects of the current invention.

FIG. 4 is a block diagram illustrating an example of a clock signal distributing device according to various aspects of the current invention. An LC resonant voltage control oscillator 304, transmission lines 310 and 314, a buffer 324 and a circuit 334 is added to the configuration of the device according to the above description. Next, aspects which are different from those above will be described.

Each of the plurality of LC resonant voltage control oscillators 302 to 304 resonates at a frequency conforming to the values of the first inductor and the first capacitor and oscillates a signal and the capacitance value of the first capacitor thereof is controlled with a digital control signal CTL. The injection locked LC resonant voltage control oscillator 301 resonates at a frequency conforming to the values of the second inductor and the second capacitor and oscillates a signal which is synchronous with the input clock signal CK, and the capacitance value of the second capacitor thereof is controlled with the digital control signal CTL. The transmission lines 311 to 313 connect the oscillation nodes of the plurality of LC resonant voltage control oscillators 302 to 304 and the injection locked LC resonant voltage control oscillator 301 with one another substantially at the same intervals. The transmission line 311 connects the oscillation node of the injection locked LC resonant voltage control oscillator 301 with the oscillation node of the LC resonant voltage control oscillator 302. The transmission line 312 connects the oscillation node of the LC resonant voltage control oscillator 302 with the oscillation node of the LC resonant voltage control oscillator 303. The transmission line 313 connects the oscillation node of the LC resonant voltage control oscillator 303 with the oscillation node of the LC resonant voltage control oscillator 304. The transmission line 310 is connected to the oscillation node of the injection locked LC resonant voltage control oscillator 301 in a direction opposite to that of the transmission line 311. The transmission line 314 is connected to the oscillation node of the LC resonant voltage control oscillator 304 in a direction opposite to that of the transmission line 313. The transmission lines 311 to 313 have substantially the same line length. Each of the transmission lines 310 and 314 has a line length which is one-half of those of the transmission lines 311 to 313. By setting the lengths of the respective transmission lines in the above mentioned manner, units of the transmission lines 310 to 314 which are connected to the LC resonant voltage control oscillators 301 to 304 may be made the same as one another. The buffer 321 amplifies a signal from the oscillation node of the injection locked LC resonant voltage control oscillator 310 and outputs the amplified signal to the circuit 331. The buffer 322 amplifies a signal from the oscillation node of the LC resonant voltage control oscillator 302 and outputs the amplified signal to the circuit 332. The buffer 323 amplifies a signal from the oscillation node of the LC resonant voltage control oscillator 303 and outputs the amplified signal to the circuit 333. The buffer 324 amplifies a signal from the oscillation node of the LC resonant voltage control oscillator 304 and outputs the amplified signal to the circuit 334. In the above mentioned manner, the clock signal distributing device may be allowed to distribute the input clock signal CK to, for example, four circuits 331 to 334.

Figure 5:
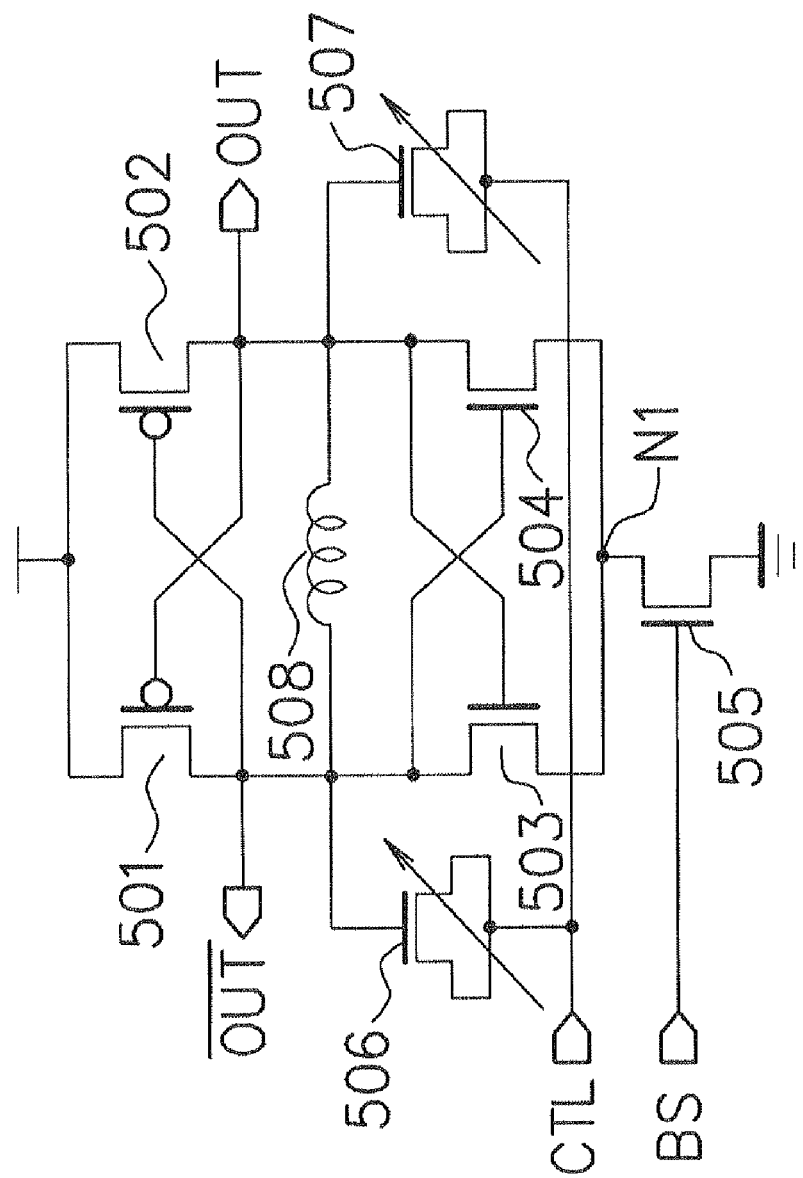
FIG. 5 is a circuit diagram illustrating an example of an LC resonant voltage control oscillator illustrated in FIG. 4.

FIG. 5 is a circuit diagram illustrating various aspects of each of the LC resonant voltage control oscillators 302 to 304 illustrated in FIG. 4. In the drawing, a positive output terminal OUT and a negative output terminal /OUT are oscillation nodes. In a first p-channel field effect transistor 501, a gate is connected to the positive output terminal (a first node) OUT, a source is connected to a supply potential node and a drain is connected to the negative output terminal (a second node). In a second p-channel field effect transistor 502, a gate is connected to the negative output terminal /OUT, a source is connected to the supply potential node and a drain is connected to the positive output terminal OUT. In a first n-channel field effect transistor 503, a gate is connected to the positive output terminal OUT, a drain is connected to the negative output terminal /OUT and a source is connected to a node N1. In a second n-channel field effect transistor 504, a gate is connected to the negative output terminal /OUT, a drain is connected to the positive output terminal OUT and a source is connected to the node N1. In an n-channel field effect transistor 505, a gate is connected to a node of a fixed bias signal BS, a drain is connected to the node N1 and a source is connected to a reference potential node (a ground potential node) so as to function as a current source. An inductor 508 is connected between the positive output terminal OUT and the negative output terminal /OUT. Variable capacitors 506 and 507 are variable capacitors whose capacitance values are controlled with the digital control signal CTL and are connected between the positive output terminal OUT and the negative output terminal /OUT.

Each of the LC resonant voltage control oscillators 302 to 304 oscillates a signal at a resonance frequency expressed by $1/\{2\pi\sqrt{(L \times C)}\}$. In the above mentioned formula, L is an inductance value of the inductor 508 and C is capacitance values of the variable capacitors 506 and 507. The capacitance values of the variable capacitors 506 and 507 are controlled with the digital control signal CTL to set the above mentioned resonance frequency to the vicinity of the frequency of the input clock signal CK. By setting the frequency in the above mentioned manner, a clock signal of a frequency which is in the vicinity of that of the input clock signal is output from the positive output terminal OUT. In addition, an inverted clock signal of the clock signal output from the positive output terminal OUT is output from the negative output terminal /OUT. The positive output terminal OUT and/ or the negative output terminal/OUT are/is connected to the transmission lines 311 to 314 and the buffers 322 to 324 illustrated in FIG. 4.

Figure 6:
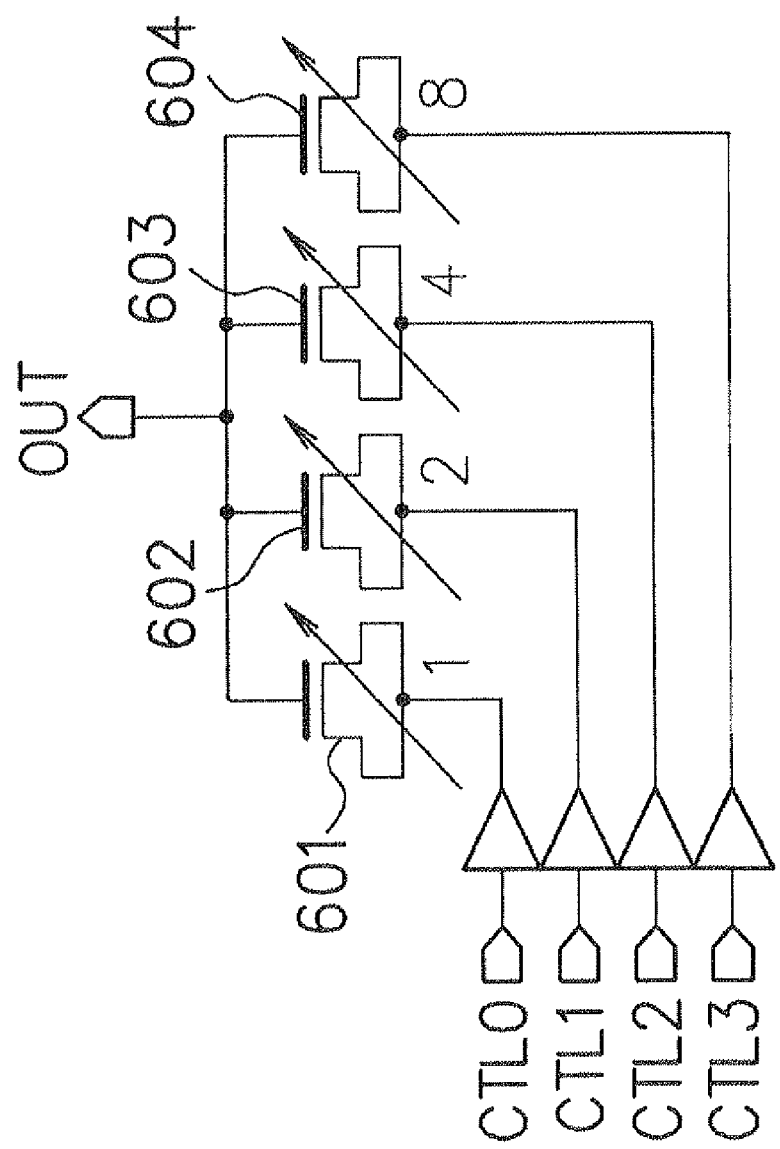
FIG. 6 is a circuit diagram illustrating an example of a variable capacitor illustrated in FIG. 5.

FIG. 6 is a circuit diagram illustrating various aspects of the variable capacitor 507 in FIG. 5. The variable capacitor 506 is the same as the variable capacitor 507 and hence the variable capacitor 507 will be described by way of example. The digital control signal CTL includes four-bit digital control signals CTL0 to CTL3. The digital control signals CTL0 to CTL3 are digital signals set at 0V or the supply voltage. The variable capacitor 507 includes variable capacitors 601 to 604. The ratio in size of four variable capacitors 601 to 604 is 1:2:4:8. With the digital control signals CTL0 to CTL3 set at 0V, the capacitance values of the variable capacitors 601 to 604 are increased. With the digital control signals CTL0 to CTL3 set at the supply voltage, the capacitance values of the variable capacitors 601 to 604 are decreased. The capacitance value of the variable capacitor 507 may be varied stepwise with the four-bit digital control signals CTL0 to CTL3. Use of the four-bit digital signals CTL0 to CTL3 may make it possible to reduce an error of noise origin in the capacitance value more effectively than would be possible by using an analog control signal.

Figure 7:
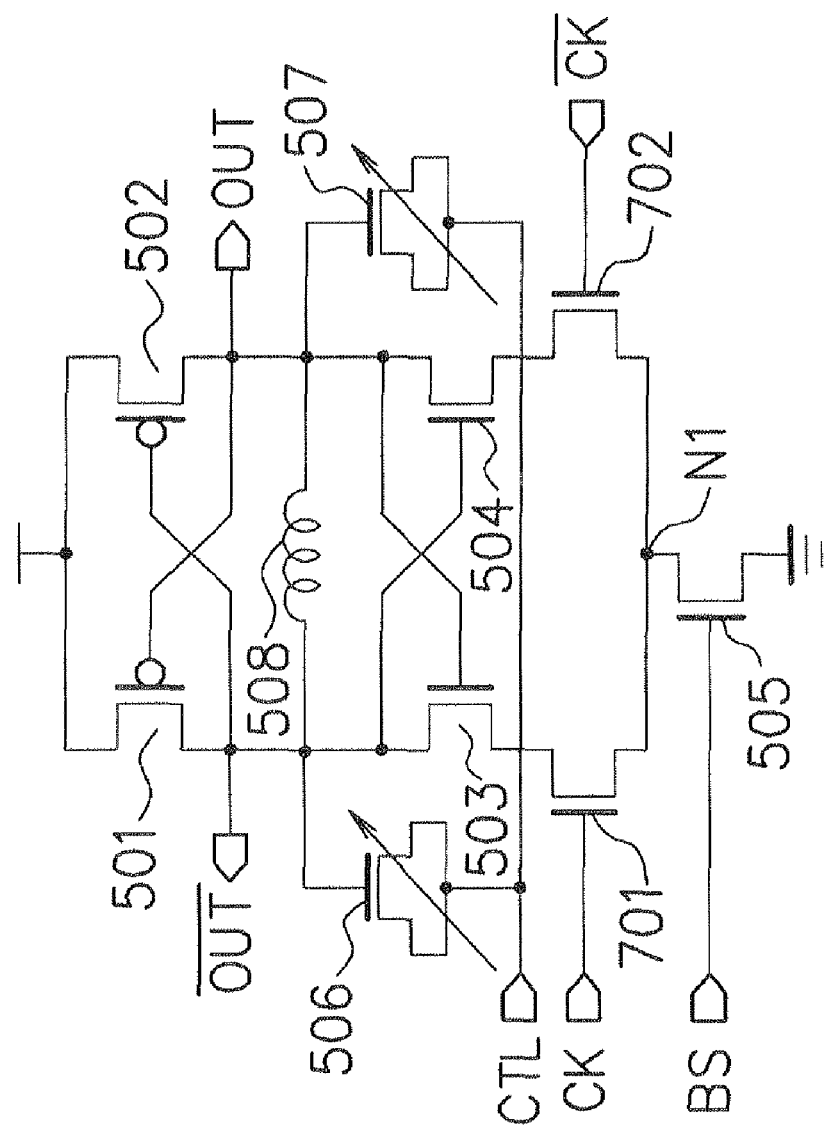
FIG. 7 is a circuit diagram illustrating an example of an injection locked LC resonant voltage control oscillator illustrated in FIG. 4.

FIG. 7 is a circuit diagram illustrating various aspects of the injection locked LC resonant voltage control oscillator 301 illustrated in FIG. 4. The injection locked LC resonant voltage control oscillator 301 illustrated in FIG. 7 is of the type that transistors 701 and 702 are added to each of the LC resonant voltage control oscillators 302 to 304 of the configuration illustrated in FIG. 5. Next, different points of the configuration illustrated in FIG. 7 from those of the configuration in FIG. 5 will be described. In a third n-channel field effect transistor 701, a gate is connected to the node of the input clock signal, a drain is connected to the source of the first n-channel field effect transistor 503 and a source is connected to the node N1. In a fourth n-channel field effect transistor 702, a gate is connected to a node of an inverted signal/CK of the input clock signal CK, a drain is connected to the source of the second n-channel field effect transistor 504 and a source is connected to the node N1. In a fifth n-channel field effect transistor 505, a gate is connected to the node of the fixed bias signal BS, a source is connected to the reference potential node and a drain is connected to the node N1.

The resonance frequency of the injection locked LC resonant voltage control oscillator 301 is expressed by $1/\{2\pi\sqrt{(L\times C)}\}$. In the above mentioned formula, L is the inductance value of the inductor 508 and C is the capacitance values of the variable capacitors 506 and 507. The capacitance values of the variable capacitors 506 and 507 are controlled with the digital control signal CTL to set the above mentioned resonance frequency to the vicinity of the frequency of the input clock signal CK. The n-channel field effect transistors 701 and 702 are turned on/off at the frequency of the input clock signal CK. As a result, a clock signal which is synchronous with the input clock signal CK and is substantially the same as the input clock signal in terms of frequency is output from the positive output terminal OUT. In addition, an inverted clock signal of the clock signal output from the positive output terminal OUT is output from the negative output terminal/OUT. The positive output terminal OUT and/or the negative output terminal/OUT are/is connected to the transmission lines 310 and 311 and the buffer 321 illustrated in FIG. 4. The resonance frequency of the injection locked LC resonant voltage control oscillator 301 is set to the vicinity of a desired frequency with the digital control signal CTL so as to output a clock signal of a desired frequency which is synchronous with the input clock signal CK.

In FIG. 4, the transmission lines 311 to 313 connect the oscillation nodes of the injection locked LC resonant voltage control oscillator 301 and the plurality of LC resonant voltage control oscillators 302 to 304 with one another substantially at the same intervals. In the case that the interval between the nodes is short, the transmission lines 310 to 314 are short-circuited and hence wiring of low resistance may be used. On the other hand, in the case that the interval between the nodes is long, the inductance component may be increased to such an extent that it may be impossible to disregard it for the transmission lines 310 to 314. As a result, the inductance value of the inductor 508 in each of the LC resonant voltage control oscillators 301 to 304 may be adversely affected and the oscillation frequency may be varied. Therefore, in the case that the interval between the nodes is long, for example, resistive elements may be used as the transmission lines 310 to 314 and their resistance values may be determined to be predominant to the inductance value.

In the case that the frequencies or phases of the oscillation signals from the injection locked LC resonant voltage control oscillator 301 and the plurality of LC resonant voltage control oscillators 302 to 304 differ from one another, current will flow through the transmission lines 311 to 313 and then the frequencies and the phases of all the oscillation signals from the injection locked LC resonant voltage control oscillator 301 and the plurality of LC resonant voltage control oscillators 302 to 304 will become substantially the same as one another in due course. That is, the oscillation signals from the injection locked LC resonant voltage control oscillator 301 and the plurality of LC resonant voltage control oscillators 302 to 304 will come into synchronization with the input clock signal CK so as to have the frequencies which are substantially the same as that of the input clock signal CK. For this purpose, the lengths of the transmission lines 311 to 313 may be substantially the same as one another.

The clock signal distributing device according to various aspects may be capable of generating and distributing high frequency clock signals in an integrated circuit chip and between the chips (in a device/between the devices) and hence is applicable to a high speed I/O circuit. For example, the device may be capable of distributing high speed clock signals of frequencies of several GHz or more to multiple channels substantially in the same phase.

The clock signal distributing device according to various aspects is illustrated in the drawing as an example of distribution of the clock signals to the circuits 331 to 334 of four channels. The clock signal distributing device includes the injection locked LC resonant voltage control oscillator 301 and the LC resonant voltage control oscillators 302 to 304 and the oscillation signal from the injection locked LC resonant voltage control oscillator 301 is made synchronous with the input clock signal CK to distribute a clock signal of a desired frequency to the circuit concerned. In addition, in order to prevent noise from being mixed into the signal while increasing an operating frequency range of the clock signal distributing device, the LC resonant voltage control oscillators 301 to 304 are used by setting the resonance frequency of each oscillator to the vicinity of a desired frequency with the digital control signal CTL.

According to various aspects, a part of the distributed voltage control oscillators 301 to 304 is configured as the injection locked voltage control oscillator 301. Therefore, it may become possible to distribute the clock signals of desired frequencies to the circuits substantially in the same phase by inputting the clock signal from the outside and making the oscillation signal from the oscillator 301 synchronous with the input clock signal CK.

The clock signal distributing device according to various aspects may be capable of distributing the clock signals to the circuits concerned with no use of the PLL circuit. Therefore, kicking-back of the clock signal from a destination to which the clock signal has been distributed to a signal source from which the clock signal is generated may be avoided. In addition, distribution of bias signals from the PLL circuit to the plurality of LC resonant oscillators is not conducted, so that noise may be prevented from being mixed into the clock signal from the bias signal. In addition, it may be possible to design the clock signal distributing device without taking the PLL circuit into consideration, so that the designing property may be improved and the degree of freedom in circuit arrangement may be increased.

Figure 8:
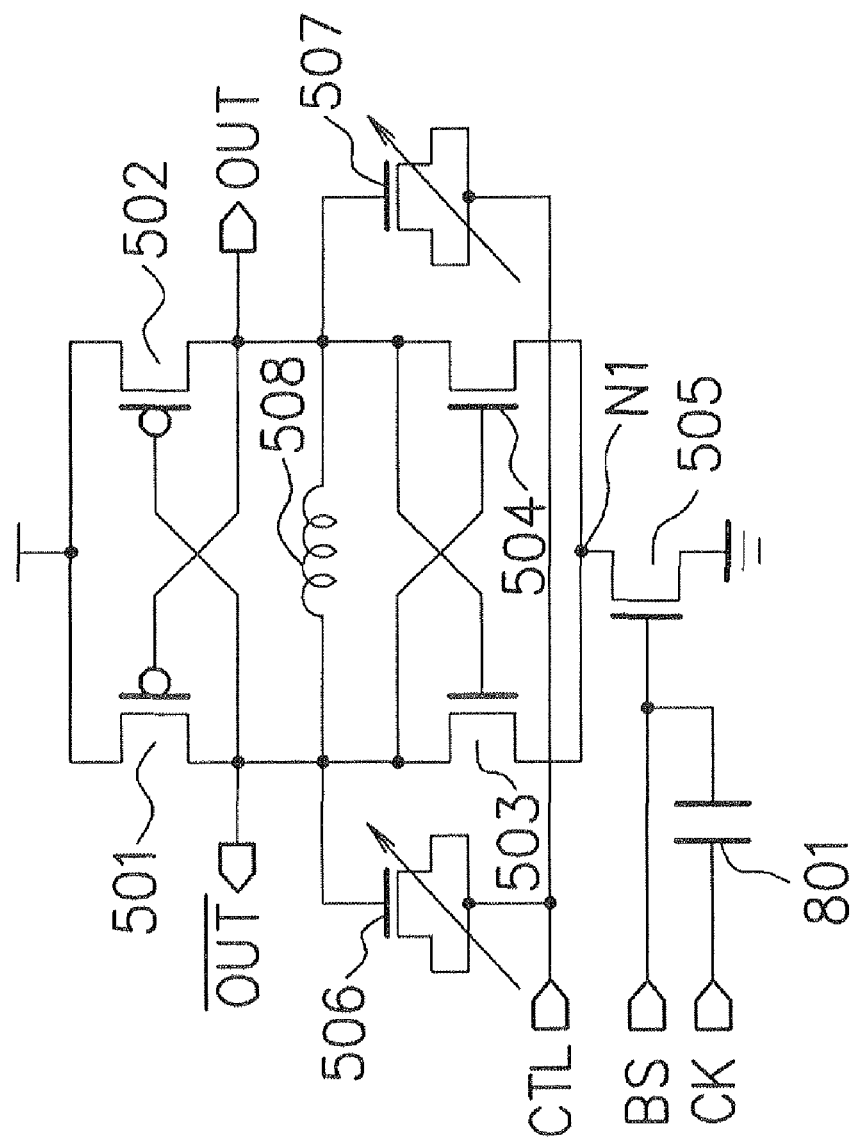
FIG. 8 is a block diagram illustrating an example of an injection locked LC resonant voltage control oscillator in a clock signal distributing device according to various aspects of the current invention.

FIG. 8 is a block diagram illustrating an example of the injection locked LC resonant voltage control oscillator 301 in the clock signal distributing device according to various aspects of the current invention. The configuration of the injection locked voltage control oscillator 301 is different from that described above. Next, different points from those above will be described. The injection locked LC resonant voltage control oscillator 301 illustrated in FIG. 8 is of the type that a capacitor 801 is added to each of the LC resonant voltage control oscillators 302 to 304 of the configuration illustrated in FIG. 5. The capacitor 801 is connected between the node of the input clock signal CK and the gate of the n-channel field effect transistor 505. The injection locked LC resonant voltage control oscillator 301 according to various aspects may be capable of outputting clock signals of a frequency which is one/half of that of the input clock signal CK from the output terminals OUT and /OUT.

The resonance frequency of the injection locked LC resonant voltage control oscillator 301 is expressed by 1/{2π√(L× C)}. In the above mentioned formula, L is the inductance value of the inductor 508 and C is the capacitance values of the variable capacitors 506 and 507. The capacitance values of the variable capacitors 506 and 507 are controlled with the digital control signal CTL to set the above mentioned resonance frequency to the vicinity of the frequency which is one-half of that of the input clock signal CK. Likewise, the resonance frequency of each of the LC resonant voltage control oscillators 302 to 304 of the configuration illustrated in FIG. 5 is also set to the vicinity of the frequency which is one-half of that of the input clock signal CK.

The capacitor 801 cuts out the DC component in the input clock signal CK and transmits only the AC component to the gate of the n-channel field effect transistor 505. The n-channel field effect transistor 505 is turned on/off at the frequency of the input clock signal CK. As a result, a clock signal which is synchronous with the input clock signal CK and has substantially the same frequency as a signal obtained by halving the frequency of the input clock signal CK is output from the positive output terminal OUT. That is, the clock signal which is halved in frequency relative to the input clock signal CK is output from the positive output terminal OUT. An inverted clock signal of the clock signal to be output from the positive output terminal OUT is output from the negative output terminal /OUT. The positive output terminal OUT and/or the negative output terminal /OUT are/is connected to the transmission lines 310 and 311 and the buffer 321 illustrated in FIG. 4.

The clock signal distributing device according to various aspects includes the injection locked LC resonant voltage control oscillator 310 illustrated in FIG. 8 and the LC resonant voltage control oscillators 302 to 304 of the configuration illustrated in FIG. 5 and distributes the clock signals obtained by halving the frequency of the input clock signal CK. The injection locked LC resonant voltage control oscillator 301 of the configuration illustrated in FIG. 8 may be capable of inputting a clock signal whose frequency is two times the resonance frequencies of the inductor 508 and the variable capacitors 506 and 507 into the gate of the n-channel field effect transistor 505 and outputting the clock signal which is frequency-divided by making it synchronous with the input clock signal CK. Owing to the above mentioned operations, the injection locked LC resonant voltage control oscillator 301 functions as a frequency divider to oscillate the signal at the frequency obtained by dividing the frequency of the input clock signal CK.

Figure 9:
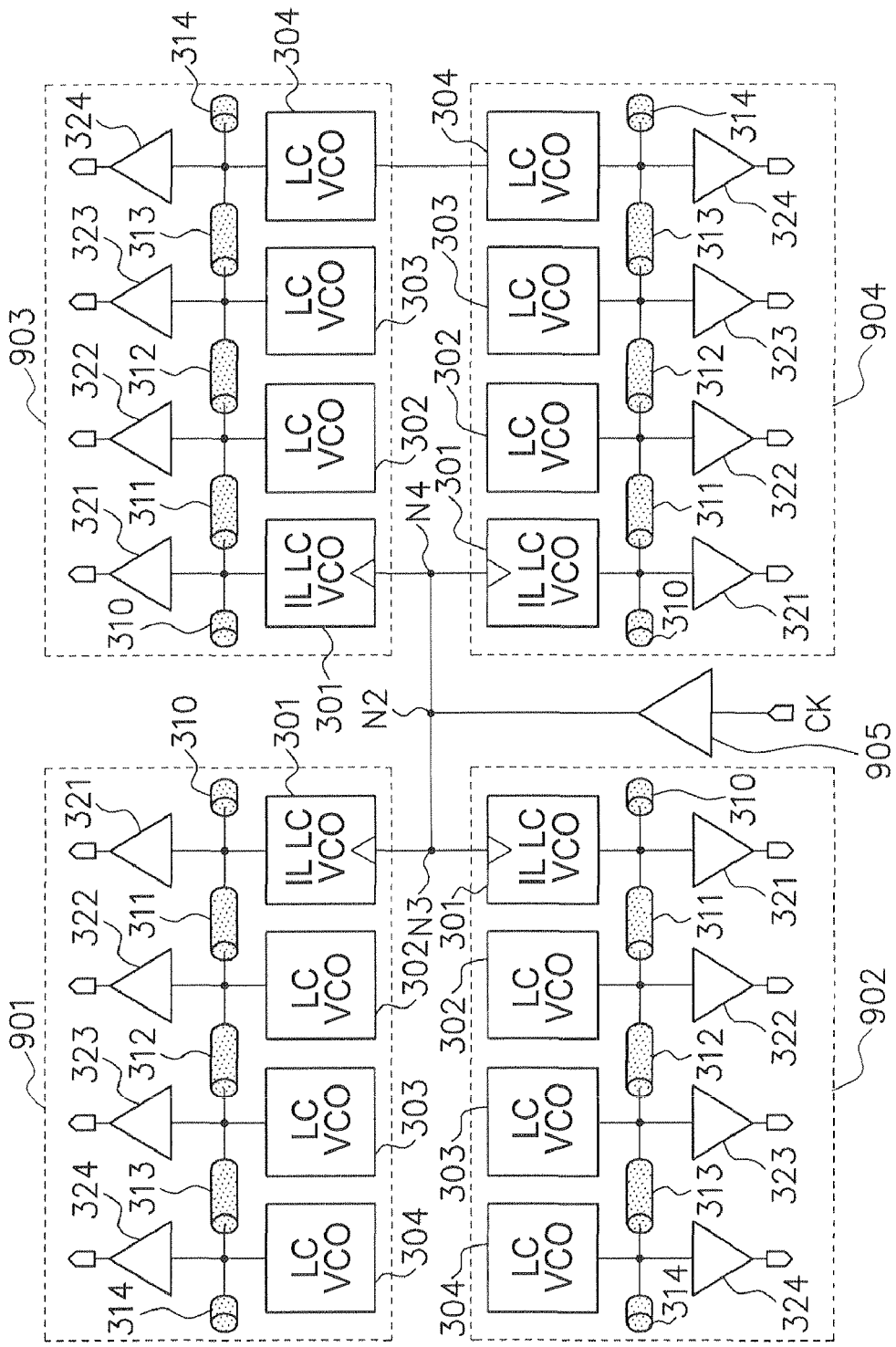
FIG. 9 is a block diagram illustrating an example of a clock signal distributing device according to various aspects of the current invention.

FIG. 9 is a block diagram illustrating an example of a clock signal distributing device according to various aspects of the current invention. The clock signal distributing device according to various aspects includes four blocks 901 to 904 and distributes clock signals to circuits of 4×4 channels. Each of the blocks 901 to 904 has the same configuration as that of the clock signal distributing device illustrated in FIG. 4. Clock signals which are substantially the same as one another are input into the injection locked LC resonant voltage control oscillators 301 in the respective blocks 901 to 904 via a buffer 905. An output terminal of the buffer 905 is connected to a node N2. The node N2 is connected to the injection locked LC resonant voltage control oscillators 301 in the blocks 901 and 902 via a node N3. The node N2 is also connected to the injection locked LC resonant voltage control oscillators 301 in the blocks 903 and 904 via a node N4. The length of a transmission line between the nodes N2 and N3 is the same as that of a transmission line between the nodes N2 and N4. The length of a transmission line between the injection locked LC resonant voltage control oscillator 301 and the node N3 in each of the blocks 901 and 902 is substantially the same as that of a transmission line between the injection locked LC resonant voltage control oscillator 301 and the node N4 in each of the blocks 903 and 904. Owing to setting of the lengths of the transmission lines in the above mentioned manner, clock signals are input into the injection locked LC resonant voltage control oscillators 301 in the blocks 901 to 904 in a state that all the signals are substantially the same as one another in terms of frequency and phase. That is, all distributed clock signals of 16 channels are output from the blocks 901 to 904 in a state that these signals synchronize with the input clock signal CK to have the frequencies which are substantially the same as that of the input clock signal CK. The clock signal distributing device according to various aspects may be capable of distributing the clock signals which are substantially the same as one another in terms of phase and desired frequency to all the channels by making the oscillation signals from the injection locked LC resonant voltage control oscillators 301 in the four blocks 901 to 904 synchronous with the input clock signal CK.

Wiring of the transmission lines 311 to 314 is not limited to one-dimensional wiring and may be two-dimensional meshed wiring. In the latter case, the injection locked LC resonant voltage control oscillator 301 and the LC resonant voltage control oscillators 302 to 304 may be arrayed two-dimensionally to distribute clock signals two-dimensionally.

As described above, each of the clock signal distributing devices according to the above aspects may be capable of distributing the clock signals with no use of the PLL circuit, so that the clock signal may be prevented from being kicked back from the clock signal distribution destination to the clock signal generation source and hence distribution of high quality clock signals may become possible.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the various aspects of the present inventions have been described in detail, it should be understood that the various changes, substitutions, and alterations could be made hereto without departing from the spirit and scope of the invention.

The invention claimed is:

1. A clock signal distributing device comprising:
a plurality of LC resonant oscillators, each resonating at a frequency corresponding to values of a first inductor and a first capacitor to oscillate a signal;
an injection locked LC resonant oscillator that resonates at a frequency corresponding to values of a second inductor and a second capacitor to oscillate a signal that is synchronous with an input clock signal; and
transmission lines that connect oscillation nodes of the plurality of LC resonant oscillators and of the injection locked LC resonant oscillator,
wherein the injection locked LC resonant oscillator includes:
a first p-channel field effect transistor having a gate connected to a first node, a source connected to a supply potential node and a drain connected to a second node;
a second p-channel field effect transistor having a gate connected to the second node, a source connected to the supply potential node and a drain connected to the first node;
a first n-channel field effect transistor having a gate connected to the first node and a drain connected to the second node;
a second n-channel field effect transistor having a gate connected to the second node and a drain connected to the first node;
a third n-channel field effect transistor having a gate connected to a node of the input clock signal and a drain connected to the source of the first n-channel field effect transistor;
a fourth n-channel field effect transistor having a gate connected to a node of an inverted signal of the input clock signal and a drain connected to the source of the second n-channel field effect transistor; and
a fifth n-channel field effect transistor having a source connected to a reference potential node and a drain connected to the sources of the third and fourth n-channel field effect transistors,
wherein the second inductor is connected between the first and second nodes, and the second capacitor is connected between the first and second nodes.

2. The clock signal distributing device according to claim 1, wherein the first capacitors in the plurality of LC resonant oscillators and the second capacitor in the injection locked LC resonant oscillator are variable capacitors whose capacitance values are controlled with a digital signal, and resonance frequencies of the plurality of LC resonant oscillators and of the injection locked LC resonant oscillator are determined in accordance with the values of the variable capacitors.

3. The clock signal distributing device according to claim 1, wherein the transmission lines comprise one-dimensional wiring or two-dimensional meshed wiring.

4. The clock signal distributing device according to claim 1, wherein the transmission lines comprise resistive elements.

5. The clock signal distributing device according to claim 1, wherein the injection locked LC resonant oscillator oscillates the signal at a frequency obtained by dividing the frequency of the input clock signal.

6. The clock signal distributing device according to claim 1, wherein the transmission lines connect the oscillation nodes of the plurality of LC resonant oscillators and of the injection locked LC resonant oscillator at same intervals.

7. The clock signal distributing device according to claim 1, wherein the plurality of LC resonant oscillators and the injection locked LC resonant oscillator oscillate the signals that have the same frequency and phase.

8. The clock signal distributing device according to claim 1, further comprising:
a plurality of blocks, each block including the plurality of LC resonant oscillators, the injection locked LC resonant oscillator and the transmission lines, wherein the same input clock signal is input into the injection locked LC resonant oscillators in the plurality of blocks.

* * * * *